United States Patent
Nomura et al.

(10) Patent No.: US 11,804,361 B2
(45) Date of Patent: Oct. 31, 2023

(54) CHARGED PARTICLE BEAM WRITING METHOD, CHARGED PARTICLE BEAM WRITING APPARATUS, AND COMPUTER-READABLE RECORDING MEDIUM

(71) Applicant: NuFlare Technology, Inc., Yokohama (JP)

(72) Inventors: Haruyuki Nomura, Yokohama (JP); Noriaki Nakayamada, Kamakura (JP); Munehiro Ogasawara, Hiratsuka (JP)

(73) Assignee: NuFlare Technology, Inc., Yokohama (JP)

( * ) Notice: Subject to any disclaimer, the term of this patent is extended or adjusted under 35 U.S.C. 154(b) by 5 days.

(21) Appl. No.: 17/661,188

(22) Filed: Apr. 28, 2022

(65) Prior Publication Data
US 2022/0384142 A1   Dec. 1, 2022

(30) Foreign Application Priority Data

May 18, 2021 (JP) .................. 2021-084008
Apr. 15, 2022 (JP) .................. 2022-067706

(51) Int. Cl.
*H01J 37/317* (2006.01)
*H01J 37/147* (2006.01)
(Continued)

(52) U.S. Cl.
CPC ........ *H01J 37/3174* (2013.01); *H01J 37/147* (2013.01); *H01J 37/3026* (2013.01); *H01J 37/3045* (2013.01)

(58) Field of Classification Search
CPC .. H01J 37/147; H01J 37/3026; H01J 37/3045; H01J 37/3174
See application file for complete search history.

(56) References Cited

U.S. PATENT DOCUMENTS 7,652,271 B2  1/2010  Wake et al.
8,129,698 B2  3/2012  Nakayamada et al.
(Continued)

FOREIGN PATENT DOCUMENTS

JP   2002-158167 A   5/2002
JP   2010-250286 A   11/2010
(Continued)

OTHER PUBLICATIONS

Wandel et al., "The trouble starts with using electrons—Putting charging effect correction models to test", Photomask Technology, Proc.of SPIE, vol. 8166, No. 1, 2011, pp. 1-10, XP060021545.
(Continued)

*Primary Examiner* — Sean M Luck
(74) *Attorney, Agent, or Firm* — Oblon, McClelland, Maier & Neustadt, L.L.P.

(57) ABSTRACT

In a charged particle beam writing method according to one embodiment, a deflector is caused to deflect a charged particle beam and a pattern is written by irradiating a substrate with the charged particle beam. The charged particle beam writing method includes calculating a charge amount distribution based on a charge amount of a beam irradiation region on the substrate immediately after irradiation with the charged particle beam and a diffusion coefficient for electric charge of the substrate, calculating a position shift distribution of the charged particle beam on the substrate based on the charge amount distribution, and correcting an irradiation position of the charged particle beam based on the position shift distribution.

9 Claims, 7 Drawing Sheets

(51) Int. Cl.
*H01J 37/302* (2006.01)
*H01J 37/304* (2006.01)

(56) References Cited

U.S. PATENT DOCUMENTS

| | | | |
|---|---|---|---|
| 8,178,856 B2 | 5/2012 | Nakayamada et al. | |
| 9,355,816 B2 | 5/2016 | Ookawa et al. | |
| 10,236,160 B2 | 3/2019 | Nakayamada | |
| 10,410,830 B2 | 9/2019 | Nakayamada | |
| 10,950,413 B2 | 3/2021 | Nakayamada | |
| 2007/0194250 A1* | 8/2007 | Suzuki | B82Y 10/00 250/492.2 |
| 2009/0242787 A1* | 10/2009 | Nakayamada | H01J 37/3026 250/492.22 |
| 2010/0237469 A1 | 9/2010 | Saito et al. | |
| 2010/0294930 A1* | 11/2010 | Preikszas | H01J 37/026 250/307 |
| 2015/0206709 A1* | 7/2015 | Nakayamada | H01J 37/3177 250/491.1 |
| 2015/0325404 A1* | 11/2015 | Sugiyama | H01J 37/304 250/396 R |
| 2018/0090298 A1* | 3/2018 | Nakayamada | H01J 37/1472 |

FOREIGN PATENT DOCUMENTS

| | | |
|---|---|---|
| JP | 5063035 B2 | 10/2012 |
| JP | 5480496 B2 | 4/2014 |
| JP | 5480555 B2 | 4/2014 |
| JP | 2014-183098 A | 9/2014 |
| JP | 6951174 B2 | 10/2021 |
| JP | 6951922 B2 | 10/2021 |
| JP | 2021-180224 A | 11/2021 |
| JP | 7026575 B2 | 2/2022 |
| WO | WO 2021/229966 A1 | 11/2021 |

OTHER PUBLICATIONS

Mizuno et al., "Non-charging Conditions of Insulating Film under Electron Beam Irradiation", e-Journal of Surface Science and Nanotechnology, vol. 18, 2020, pp. 106-109, XP055966399, Retrieved from the Internet: URL:https://www.jstage.jst.go.jp/article/ejssnt/18/0/18_106/_pdf/-char/en>.

Extended European Search Report dated Oct. 17, 2022 in European Patent Application No. 22172738.1, 5 pages.

* cited by examiner

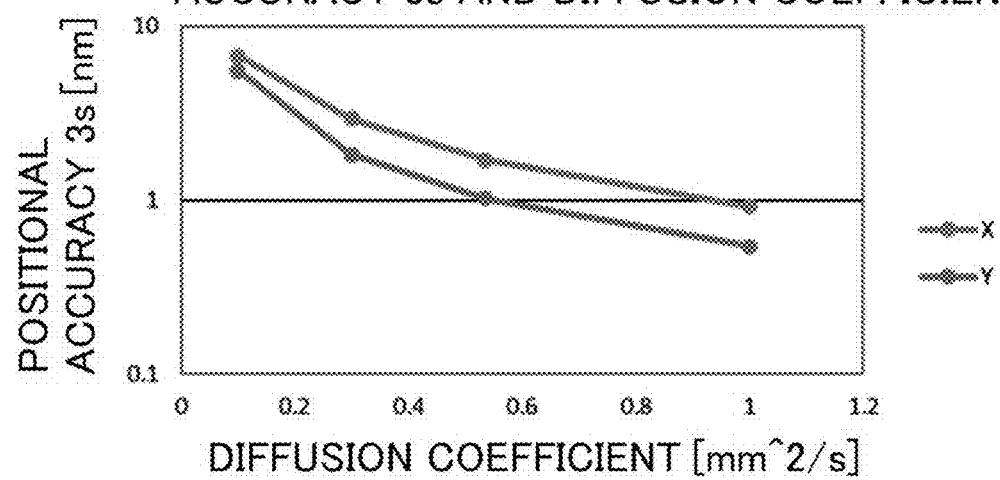
FIG.6 RELATIONSHIP BETWEEN POSITIONAL ACCURACY 3s AND DIFFUSION COEFFICIENT
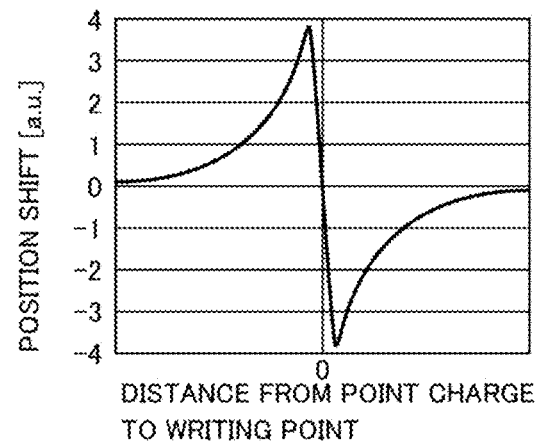
FIG.7

FIG.8 EXAMPLE OF MEASUREMENT RESULT
Dexp=30uC/cm^2
$P_{meas}(x_i, y_i, D_{exp})$
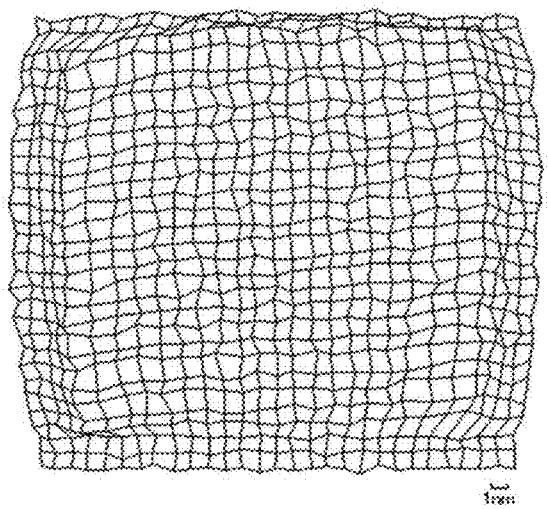
EXAMPLE OF SIMULATION RESULT
$P_{sim}(x_i, y_i, Q=1, D=0.5mm^2/sec)$
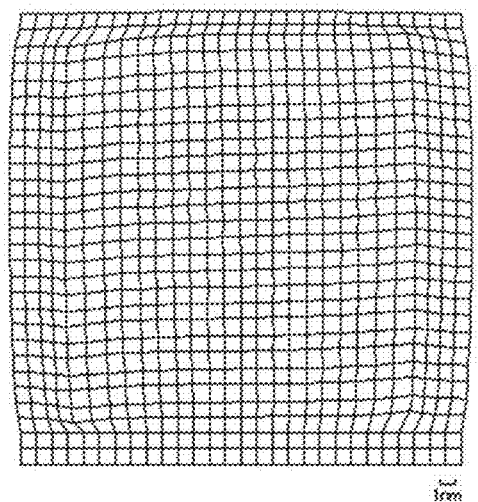
FIG.9

CHARGED PARTICLE BEAM WRITING METHOD, CHARGED PARTICLE BEAM WRITING APPARATUS, AND COMPUTER-READABLE RECORDING MEDIUM

CROSS REFERENCE TO RELATED APPLICATION

This application is based upon and claims benefit of priority from the Japanese Patent Application No. 2021-84008, filed on May 18, 2021, and the Japanese Patent Application No. 2022-67706, filed on Apr. 15, 2022, the entire contents of which are incorporated herein by reference.

FIELD

The present invention relates to a charged particle beam writing method, a charged particle beam writing apparatus, and a computer-readable recording medium.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

In a case where a substrate such as a mask is irradiated with an electron beam, an irradiation position and its surrounding region are charged by electron beam irradiation performed in the past, and the irradiation position is shifted. Hitherto, as a method for eliminating this beam irradiation position shift, a method is known in which the surface of a substrate is prevented from being charged by forming a charge dissipation layer (CDL) on the substrate. However, this charge dissipation layer affects a chemically amplified resist applied onto the substrate, so that a pattern defect may occur or the consistency of pattern dimensions may be affected. Thus, there may be a case where usable charge dissipation layers are limited depending on compatibility with the resist.

There is a problem in that a sufficient static elimination effect cannot be obtained depending on the type of charge dissipation layer, and a beam irradiation position is shifted due to the charging effect caused by charge that could not be fully eliminated.

BRIEF DESCRIPTION OF THE DRAWINGS

FIG. 6 is a graph illustrating a relationship between a positional accuracy and a diffusion coefficient.

FIG. 7 is a graph illustrating position shifts caused by a point charge.

FIG. 8 is a diagram illustrating a position shift measurement result.

FIG. 9 is a diagram illustrating a position shift simulation result.

DETAILED DESCRIPTION

In a charged particle beam writing method according to one embodiment, a deflector is caused to deflect a charged particle beam and a pattern is written by irradiating a substrate with the charged particle beam. The charged particle beam writing method includes calculating a charge amount distribution based on a charge amount of a beam irradiation region on the substrate immediately after irradiation with the charged particle beam and a diffusion coefficient for electric charge of the substrate, calculating a position shift distribution of the charged particle beam on the substrate based on the charge amount distribution, and correcting an irradiation position of the charged particle beam based on the position shift distribution.

Hereinafter, an embodiment of the present invention will be described based on the drawings. In the present embodiment, a configuration will be described, which uses an electron beam as an example of a charged particle beam. However, the charged particle beam is not limited to an electron beam, and may be an ion beam or the like.

Figure 1:
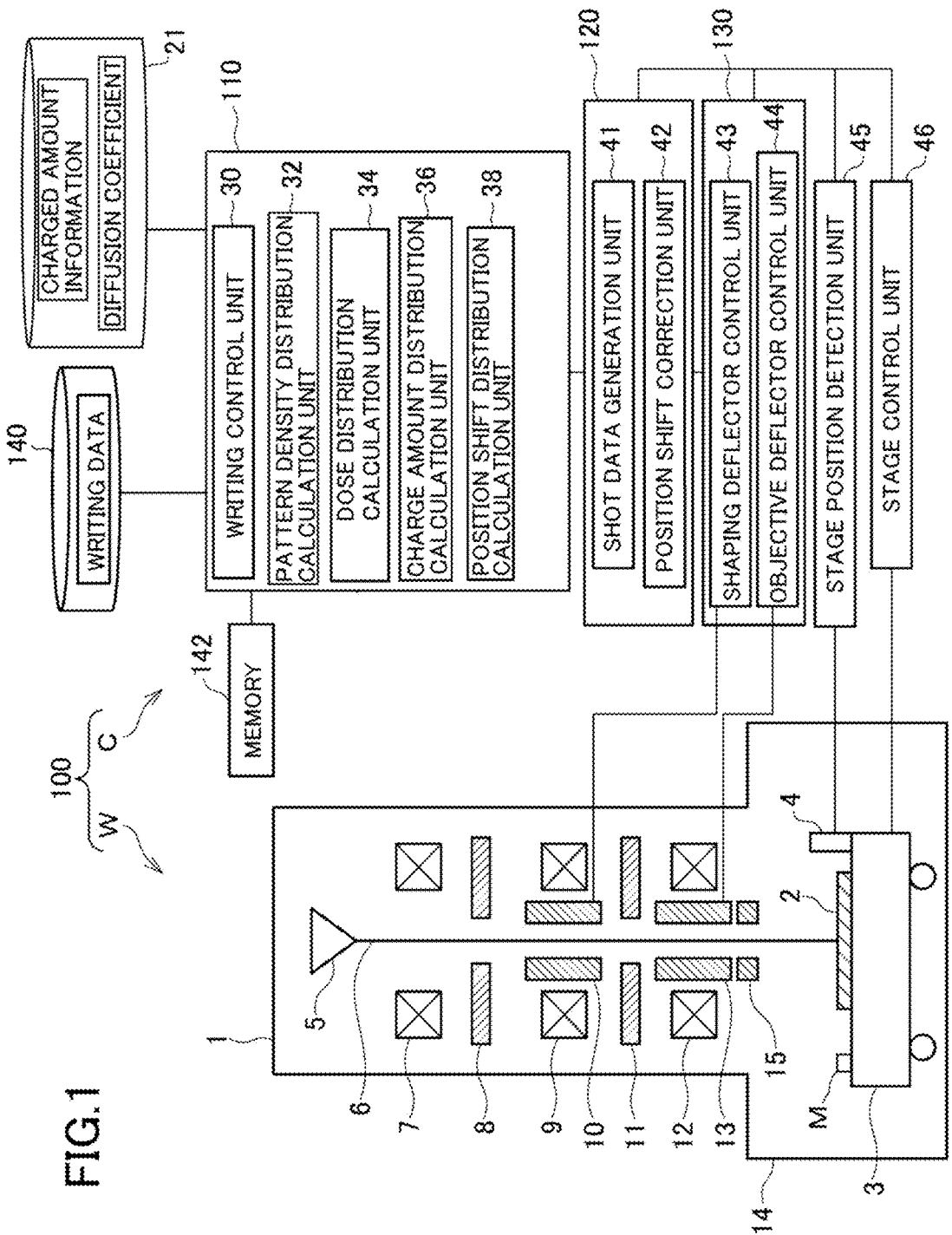
FIG. 1 is a schematic diagram of a writing apparatus according to an embodiment of the present invention.

FIG. 1 is a schematic configuration diagram of a writing apparatus according to an embodiment. A writing apparatus 100 illustrated in FIG. 1 includes a writing unit W and a control unit C. The writing apparatus 100 is an example of an electron beam writing apparatus. The writing unit W has an electric column 1 and a writing space 14. In the electric column 1, an electron gun 5, an illumination lens 7, a first aperture plate 8, a projection lens 9, a shaping deflector 10, a second aperture plate 11, an objective lens 12, an objective deflector 13, and an electrostatic lens 15 are arranged.

In the writing space 14, an XY stage 3 is arranged. A substrate 2, which is a writing target, is arranged on the XY stage 3. The substrate includes, for example, a photomask used for exposure in semiconductor manufacturing and a semiconductor wafer for forming a semiconductor device. In addition, a photomask on which writing is to be performed includes a mask blank, on which nothing has been written yet. For example, the substrate 2 has a quartz layer, a chromium film provided on the quartz layer, a resist film provided on the chromium film, and a charge dissipation layer provided on the resist film. On the XY stage 3, a mirror 4 for stage position measurement is arranged at a different position from the position where the substrate 2 is arranged.

On the XY stage 3, a mark M for calibration is provided at a different position from the position where the substrate 2 is arranged. For example, the mark M is made of metal and has a cross shape, and focus adjustment, position adjustment, deflection shape correction coefficient adjustment, and the like are performed by scanning the mark M using an electron beam and detecting reflected electrons from the mark M using a detector (not illustrated).

The control unit C has, for example, control calculators 110 and 120, a stage position detection unit 45, a stage control unit 46, a deflection control circuit 130, a memory 142, and storage devices 21 and 140 such as a magnetic disk device. The deflection control circuit 130 is connected to the shaping deflector 10 and the objective deflector 13.

The control calculator 110 has the functions of a writing control unit 30, a pattern density distribution calculation unit 32, a dose distribution calculation unit 34, a charge amount distribution calculation unit 36, and a position shift distribution calculation unit 38. The writing control unit 30 controls the entirety of the apparatus. Each unit of the control calculator 110 may be configured using hardware including, for example, an electric circuit, a computer, a circuit board, a quantum circuit, or a semiconductor device or may be configured using software, the computer having a central processing unit (CPU). Data input to and calculation results from each unit of the control calculator 110 are stored in the memory 142.

The control calculator 120 has the functions of a shot data generation unit 41 and a position shift correction unit 42. The shot data generation unit 41 and the position shift correction unit 42 may be configured using software or hardware.

The deflection control circuit 130 has the functions of a shaping deflector control unit 43 and an objective deflector control unit 44. The shaping deflector control unit 43 and the objective deflector control unit 44 may be configured using software or hardware.

Writing data (layout data) in which a plurality of shape patterns to be written are defined is stored in the storage device 140.

An electron beam 6 emitted from the electron gun 5 (an emission unit) is caused to illuminate the entirety of the first aperture plate 8, which has a rectangular hole, by the illumination lens 7. In this case, first, the electron beam 6 is shaped so as to have a rectangular shape. The electron beam 6 of a first aperture image that has passed through the first aperture plate 8 is projected onto the second aperture plate 11 by the projection lens 9. The position of the first aperture image on the second aperture plate 11 is deflected by the shaping deflector 10 controlled by the shaping deflector control unit 43, so that the beam shape and size can be changed (variable shaping).

The electron beam 6 of a second aperture image that has passed through the second aperture plate 11 is focused by the objective lens 12, deflected by, for example, an electrostatic deflector (the objective deflector 13) controlled by the objective deflector control unit 44, and applied to a desired position on the substrate 2 on the XY stage 3, which is arranged so as to be movable. The XY stage 3 is driven and controlled by the stage control unit 46. The position of the XY stage 3 is detected by the stage position detection unit 45. The stage position detection unit 45 includes, for example, a laser length measurement device that irradiates the mirror 4 with laser to measure a position on the basis of the interference between incident light and reflected light. The electrostatic lens 15 dynamically corrects the focus position of the electron beam 6 in accordance with the roughness of the surface of the substrate 2 (dynamic focus).

Figure 2:
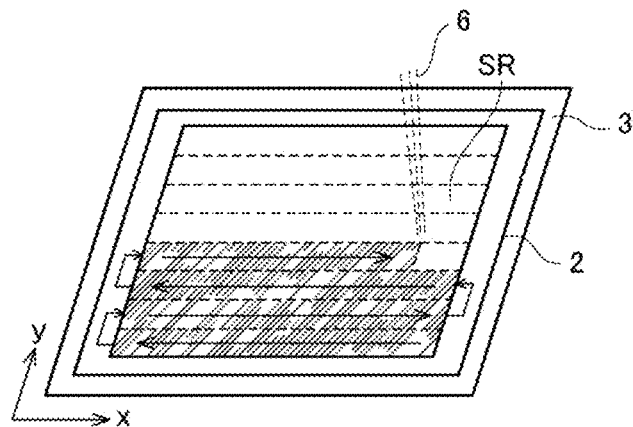
FIG. 2 is a diagram for describing the way in which a stage is moved.

FIG. 2 is a diagram for describing the way in which the stage is moved. In a case where writing is performed on the substrate 2, the XY stage 3 is continuously moved, for example, in the X direction. A writing region is virtually divided into a plurality of strip-shaped stripe regions (SR) having a width across which the electron beam 6 can be deflected. Writing processing is performed in units of stripe region. Suppose that the XY stage 3, for example, is continuously moved in the X direction, and the shot position of the electron beam 6 is simultaneously caused to track the stage movement. By causing the XY stage 3 to move continuously, a writing time can be shortened.

After writing in one stripe region is finished, the XY stage 3 is step fed in the Y direction, and a writing operation is performed in the next stripe region in the X direction (the opposite direction). The travel time of the XY stage 3 can be shortened by performing the writing operation on the individual stripe regions in a meandering manner.

In the writing apparatus 100, in order to process layout data (writing data), the writing region is virtually divided into a plurality of strip-shaped frame regions, and data processing is performed on a frame region basis. In a case where multiple exposures are not performed, normally, the frame regions are the same as the stripe regions. In a case where multiple exposures are performed, the frame regions and the stripe regions become misaligned in accordance with the number of exposures. In this manner, the writing region of the substrate 2 is virtually divided into the plurality of frame regions (stripe regions), which are a plurality of writing unit regions, and the writing unit W performs writing on a frame region (stripe region) basis.

It is known that when the substrate 2 is irradiated with an electron beam, the beam irradiation position is shifted due to the resist charging effect. Hitherto, a position shift due to the resist charging effect has been estimated from pattern data and corrected through a charging effect correction. However, there may be a case where a position shift cannot be sufficiently corrected depending on the type of the charge dissipation layer provided in the substrate 2, so that the position accuracy of beam irradiation decreases depending on conditions.

Figure 3:
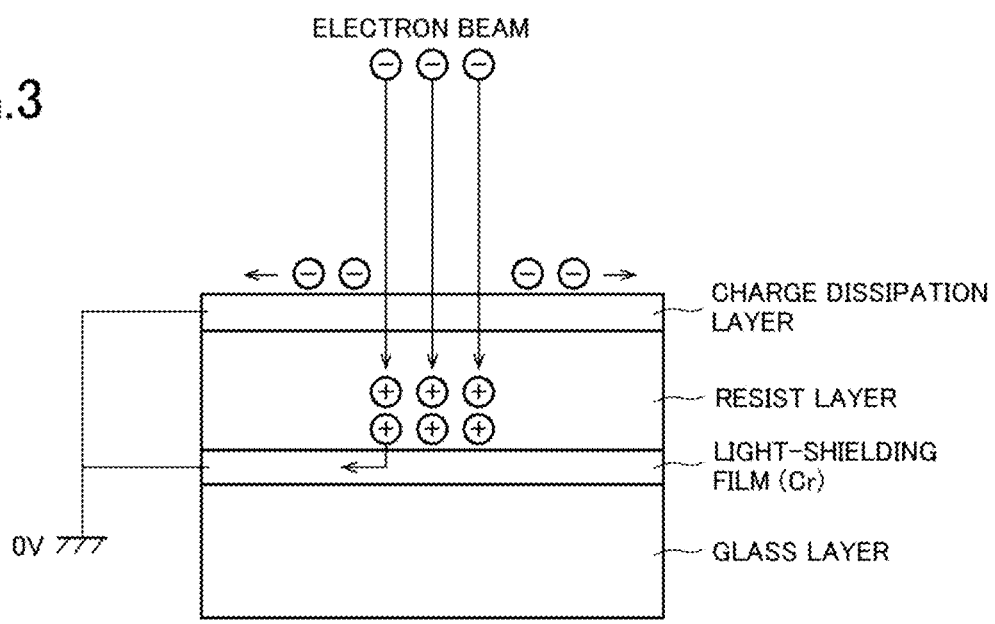
FIG. 3 is a schematic diagram illustrating diffusion of electric charge in planar directions along the surface of a substrate.

As illustrated in FIG. 3, when the substrate is irradiated with an electron beam, the surface charge diffuses in planar directions along the charge dissipation layer. The inventors found that in a case where the sheet resistance of the charge dissipation layer is not sufficiently low, electric charge diffuses significantly slowly with respect to the progress speed of writing, and the electric charge that has accumulated in the charge dissipation layer deflects the beam and affects the irradiation position of the beam.

In the present embodiment, the time-dependent diffusion of electric charge in planar directions is taken into consideration to calculate a charge amount distribution, and a position shift distribution of an electron beam is calculated on the basis of the charge amount distribution to correct the irradiation position of the beam.

Figure 4:
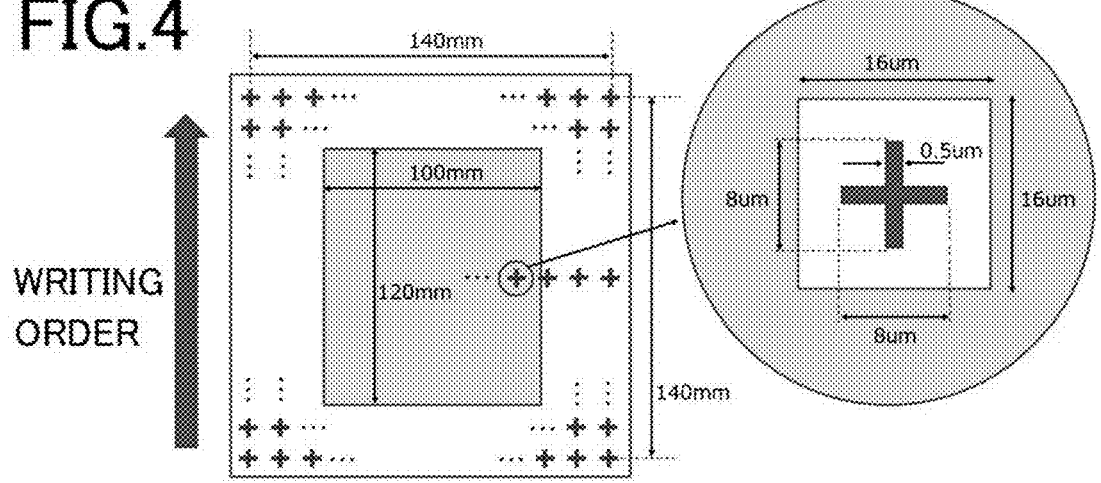
FIG. 4 is a diagram illustrating an example of a writing layout.

FIG. 4 illustrates an example of a writing layout for evaluating a difference in positional accuracy due to a difference in electric-charge diffusion coefficient. In a 140 mm×140 mm region, a cross shape having a width of 0.5 μm and vertical and horizontal dimensions of 8 μm is arranged at 29×29 positions with a 5-mm pitch to form a grid pattern for use in position measurement. A 100 mm×120 mm region at the center of the layout is arranged as a high irradiation amount region having an area density of 100% to evaluate the surface charging effect. In the high irradiation amount region, regions that are sufficiently smaller than the high irradiation amount region such as 16 µm×16 µm regions are removed so that the cross shapes of the position measurement grid pattern and the pattern of the high irradiation amount region do not overlap. Thus, a framed position measurement grid pattern is arranged. The order in which writing is performed starts from the cross shape of the grid pattern that is at an end of the layout in the −Y direction and proceeds in the +Y direction in a sequential manner, and the pattern of the high irradiation amount region and the grid pattern are written in the same frame region and are merged.

Figure 5:
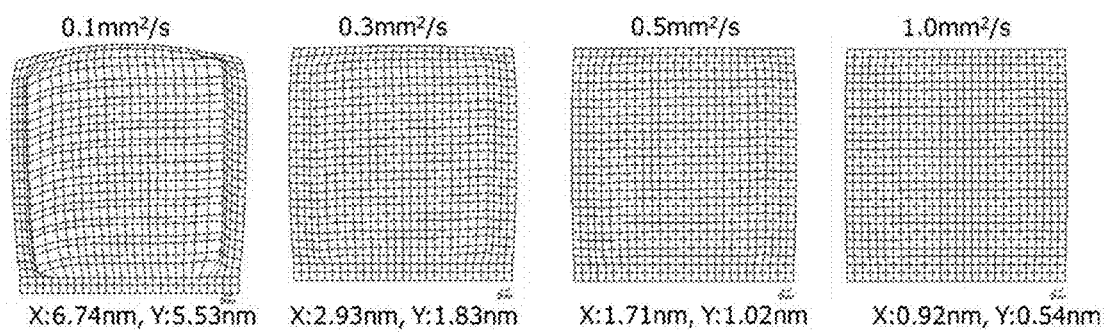
FIG. 5 is a diagram illustrating evaluation results of position shifts in a case where the layout in FIG. 4 is written.

FIG. 5 illustrates examples of evaluation results of grid pattern position shifts for different diffusion coefficients in a case where the high irradiation amount region in the layout of FIG. 4 is written with a dose of 30 µC/cm², a stage speed of 50 mm/sec, and a stripe-region width of 81 µm. In the individual results, the charge amounts immediately after beam irradiation is performed (immediately after beam irradiation is performed: a time at which irradiation with a beam having a predetermined irradiation amount is completed) are equal to each other; however, the diffusion coefficients are different and are 0.1 mm²/sec, 0.3 mm²/sec, 0.5 mm²/sec, and 1.0 mm²/sec. The relationship between positional accuracy 3s and the diffusion coefficients obtained from these evaluation results will be illustrated in FIG. 6. As illustrated in these examples, it is clear that the positional accuracy is improved when the diffusion coefficient is large; however, a position error is increased by charge remaining after static elimination when the diffusion coefficient is small.

To calculate a charge amount distribution in the present embodiment, charge amount information Q(d) and a diffusion coefficient D of electric charge (electrons) are obtained in advance, the charge amount information Q(d) representing the relationship between a charge amount Q of an irradiation region immediately after beam irradiation and an irradiation amount d.

To obtain the charge amount information and the diffusion coefficient for electric charge, first, a test layout is written. For example, with a pattern arrangement similar to the layout in FIG. 4, a plurality of layouts in which beam irradiation amounts for the pattern of the high irradiation amount region are different are written to obtain respective position errors. In order to change the intensity of beam irradiation on a layout basis, for example, it is sufficient that layouts be used in which the pattern density of the high irradiation amount region is different and is, for example, 3%, 5%, 10%, 15%, 20%, 25%, 50%, 75%, or 100%. Position shifts in the writing result for each layout from the designed positions of the cross shapes of the grid pattern are measured using a position measurement device, and a position shift distribution $P_{meas}(x_i, y_i, Q(d); D_{unknown})$ is obtained. Here, i represents number assigned to boxes arrayed on the grid of the test layout. Moreover, $D_{unknown}$ is a diffusion coefficient unique to the substrate and is determined in accordance with the procedure described below.

Next, regarding writing data for this test layout, a charge amount distribution C(x, y, t) at each time t is simulated by changing the diffusion coefficient D to a plurality of values. The writing region is divided into writing sections having a mesh size L. A charge amount after writing the 0th to j-th writing sections is calculated as an analysis solution of a two-dimensional diffusion equation as in the following Eqs. (1) to (3). In the following equations, $t_k$ represents the time at which the k-th writing section was written, and $(x_k, y_k)$ represents the position of the k-th writing section.

$$C(x, y, t) = \sum_{k=0}^{j} c_k(x, y, t) \quad (1)$$

$$c_k(x, y, t) = \frac{Q}{4} \text{erf}\left\{\left(\text{erf}\left(\frac{x - x_k - \frac{L}{2}}{\sigma}\right) - \text{erf}\left(\frac{x - x_k + \frac{L}{2}}{\sigma}\right)\right)\right. \quad (2)$$

$$\left.\left\{\text{erf}\left(\frac{x - y_k - \frac{L}{2}}{\sigma}\right) - \text{erf}\left(\frac{x - y_k + \frac{L}{2}}{\sigma}\right)\right\}\right. \quad (3)$$

$$\sigma = \sqrt{4D(t - t_k)}$$

The calculated charge amount distribution of the test layout at each time is convolved with a response function r(x, y) assumed in order to calculate a position shift from the charge amount distribution, so that a position shift distribution simulation result $P_{sim}(x_i, y_i, Q(d); D)$ of the test layout is calculated using the diffusion coefficient D. The response function r(x, y) is, for example, a function representing the relationship between the distance from a point charge to a desired writing point and a position shift as illustrated in FIG. 7.

FIG. 8 illustrates an example of a measurement result $P_{meas}(x_i, y_i, Q(d); D_{unknown})$. FIG. 9 illustrates a simulation result $P_{sim}(x_i, y_i, Q=1 \text{ nC/cm}^2, D=0.5 \text{ mm}^2/\text{sec})$ in a case where a certain diffusion coefficient is used and Q=1 (nC/cm²).

A correlation between a position shift distribution $P_{meas}(x_i, y_i, Q(d); D_{unknown})$ calculated from these test-layout writing results and a simulation result $P_{sim}(x_i, y_i, Q=1, D)$ is obtained, and the diffusion coefficient D that results in the smallest residual is determined to be an optimal diffusion coefficient. Moreover, the charge amount immediately after the irradiation is determined from the slope of the correlation (a correlation coefficient), which is denoted by Q, at that time. For example, the charge amount can be determined by confirming how many times the position shift represented by the writing result is greater than the position shift simulation result obtained at Q=1 [nC/cm²]. In a case where the correlation coefficient is 3, the charge amount immediately after the irradiation is 3 [nC/cm²].

Figure 10:
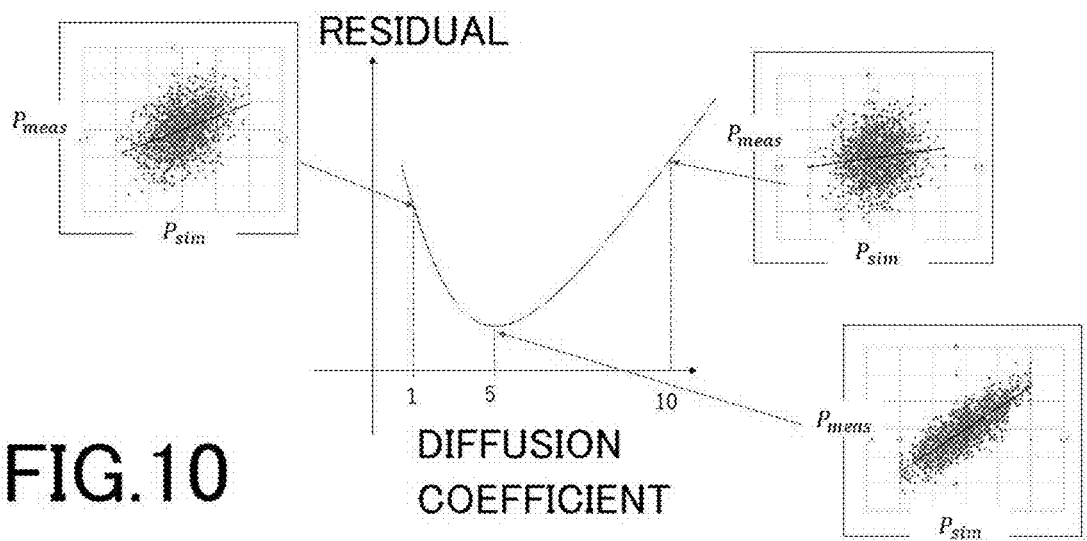
FIG. 10 is a graph illustrating residuals obtained in a case where the position shift measurement result and the position shift simulation result are correlated to each other on a diffusion coefficient basis.

FIG. 10 illustrates an example of residuals obtained in a case where the position shift distribution $P_{meas}(x_i, y_i, Q(d); D_{unknown})$ and the simulation result $P_{sim}(x_i, y_i, Q=1, D)$ are correlated to each other. In this example, when the diffusion coefficient is 0.5, the diffusion coefficient is optimal. By using a correlation coefficient Q satisfying $P_{meas} = Q \cdot P_{sim}$ in this case, a charge amount immediately after writing through irradiation is calculated.

Figure 11:
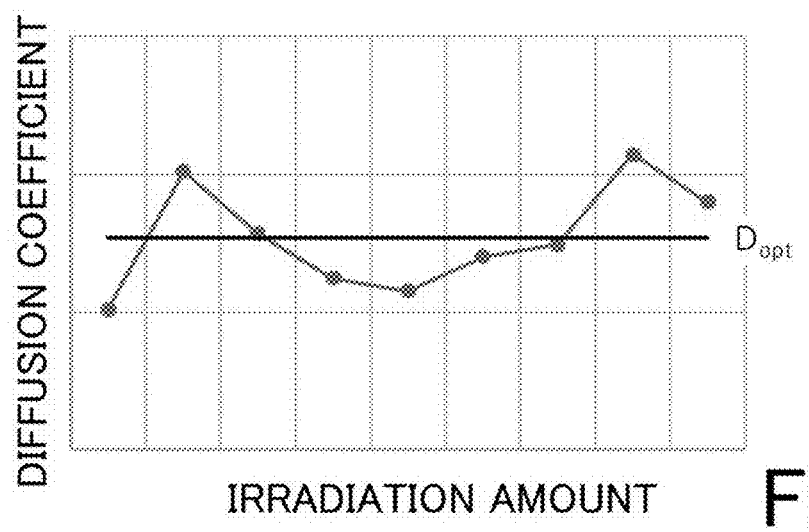
FIG. 11 is a graph illustrating optimal diffusion coefficients on an irradiation amount basis.

Similarly, the above-described analysis is performed on each of the position shift distributions $P_{meas}(x_i, y_i, Q(d); D_{unknown})$ obtained from writing results under a plurality of irradiation amount conditions at the time when the test layout is written. As illustrated in FIG. 11, for each irradiation amount condition, the diffusion coefficient D (a first diffusion coefficient) is obtained. For example, the average of these coefficients is calculated as an optimal diffusion coefficient $D_{opt}$ (a second diffusion coefficient). The optimal diffusion coefficient $D_{opt}$ is stored as the diffusion coefficient D in the storage device 21.

Figure 12:
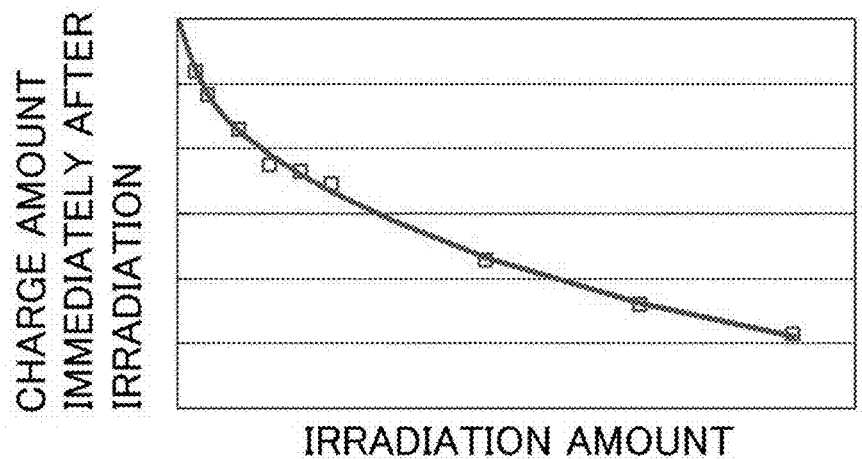
FIG. 12 is a graph illustrating the relationship between an irradiation amount and a charge amount immediately after irradiation.

As illustrated in FIG. 12, for each irradiation amount condition, a charge amount Q(d) immediately after irradiation is calculated. Information representing a correspondence between this irradiation amount condition and the charge amount Q(d) is registered as charge amount information in the storage device 21.

Figure 13:
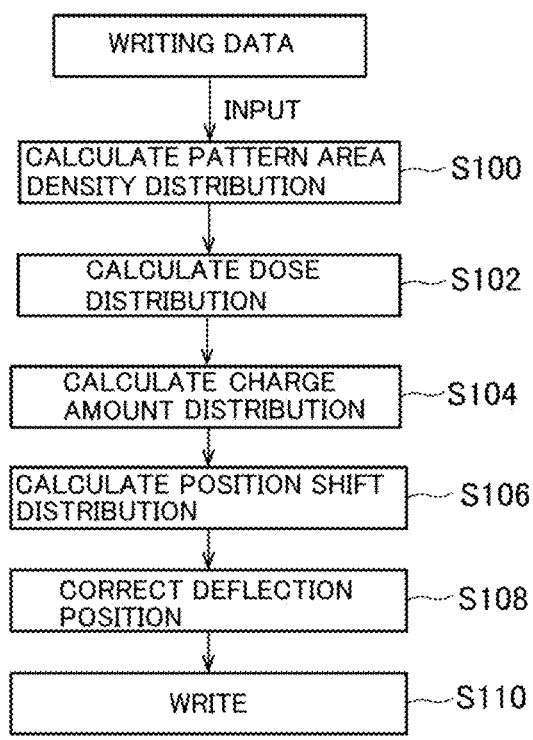
FIG. 13 is a flow chart for describing a writing method according to the present embodiment.

A writing method using a writing apparatus using the storage device 21 in which the charge amount information and the diffusion coefficient are stored will be described in accordance with the flow chart illustrated in FIG. 13. This writing method has a pattern area density distribution calculation process (step S100), a dose distribution calculation process (step S102), a charge amount distribution calculation process (step S104), a position shift distribution calculation process (step S106), a deflection position correction process (step S108), and a writing process (step S110).

In the pattern area density distribution calculation process (step S100), the pattern density distribution calculation unit 32 reads out writing data from the storage device 140, virtually divides the writing region (or the frame regions) in a mesh-like manner so as to have predetermined dimensions (grid dimensions), and calculates, for each mesh region, a pattern density representing the arrangement ratio of a shape pattern defined in the writing data. For each mesh region, the distribution of a pattern density p is then generated.

In the dose distribution calculation process (step S102), the dose distribution calculation unit 34 (an irradiation amount arithmetic unit) calculates, for each mesh region, the distribution of the dose d using the pattern density distribution. The dose d can be calculated using the following Eq. (4). In the following equation, η denotes a back-scattering coefficient, and $d_{100}$ denotes a reference dose (a dose when the pattern density is 100%). An irradiation amount is obtained by calculating the product of a dose and a pattern density.

$$d=d_{100}*\{(\tfrac{1}{2}+\eta)/(\tfrac{1}{2}+\eta*p)\} \quad (4)$$

In the charge amount distribution calculation process (step S104), the charge amount distribution calculation unit 36 reads out the charge amount information and the diffusion coefficient D from the storage device 21, and calculates, by referring to the charge amount information, a charge amount Q of the irradiation region immediately after irradiation from the irradiation amount calculated in step S102. Using the calculated charge amount Q and the read-out diffusion coefficient D, the charge amount distribution calculation unit 36 calculates a charge amount distribution by calculating, for each mesh region, a charge amount using the above-described Eqs. (1) to (3).

In the position shift distribution calculation process (step S106), the position shift distribution calculation unit 38 (a position shift arithmetic unit) calculates a position shift based on the charge amount distribution. Specifically, the position shift distribution calculation unit 38 calculates position shifts of writing positions due to the charge amounts at individual positions in the charge amount distribution by convolving the charge amount distribution calculated in step S104 with the response function r(x, y), where (x, y) represents beam irradiation position in the frame region on which data processing is currently performed.

The position shift distribution calculation unit 38 then generates a position shift distribution from the position shift for each position (x, y) that is a writing target position in the frame region. The generated position shift distribution is output to the control calculator 120.

In the control calculator 120, the shot data generation unit 41 reads out the writing data from the storage device 140 and generates shot data in a format unique to the writing apparatus 100 by performing multistage data conversion processing. The size of a shape pattern defined in the writing data is normally larger than the shot size that can be formed in one shot by the writing apparatus 100. Thus, in the writing apparatus 100, each shape pattern is divided into a plurality of shot shapes so as to have a size that can be formed in one shot by the writing apparatus 100 (shot division). For each shot shape, data such as a shape code representing a shape type, coordinates, and a size are defined as shot data.

In the deflection position correction process (step S108) (a position shift correction process), the position shift correction unit 42 corrects the irradiation position using the position shift calculated in step S106. In this case, the shot data for each position is corrected. Specifically, to the shot data for each position (x, y), a correction value for correcting the position shift represented by the position shift distribution is added. It is preferable that, for example, a value obtained by inverting the positive/negative sign of the position shift represented by the position shift distribution be used as the correction value. As a result, in a case where irradiation with the electron beam 6 is performed, the coordinates of the irradiation destination are corrected, and thus the deflection position to which the beam is deflected by the objective deflector 13 is corrected. Pieces of shot data are defined in a data file such that the pieces of shot data are sorted in shot order.

In the writing process (step S110), in shot order, the shaping deflector control unit 43 calculates, for each shot shape, the amount of deflection of the shaping deflector 10 for changing the shape of the electron beam 6, the amount of deflection being calculated from the shape type and size defined in the shot data. Moreover, the objective deflector control unit 44 calculates the amount of deflection of the objective deflector 13 for deflecting the subject shot shape to an irradiation position on the substrate 2. In other words, the objective deflector control unit 44 (a deflection amount arithmetic unit) calculates the amount of deflection for deflecting the electron beam to a corrected irradiation position. The objective deflector 13 arranged in the electronic lens barrel 1 then deflects the electron beam in accordance with the calculated amount of deflection to irradiate the corrected irradiation position with the electron beam. As a result, the writing unit W writes the pattern at a certain position on the substrate 2, the position being determined as a result of charge correction.

In this manner, in the present embodiment, since a shift in beam irradiation position is calculated from the charge distribution of electrons diffusing at low speed along the surface of the substrate, the beam irradiation position can be corrected with high accuracy.

As illustrated in FIG. 3, when the substrate is irradiated with an electron beam, holes (positive holes) generated due to emission of secondary electrons accumulate in the resist film and are gradually attenuated by being absorbed by the light-shielding film. Since the resist film is an insulator, holes do not move in the planar directions, and charging occurs at the beam irradiation position. The irradiation position may be corrected by further taking a direct charge amount distribution at such a beam irradiation position into consideration.

Moreover, depending on the composition of the charge dissipation layer, there may be a case where holes (positive holes) generated due to emission of secondary electrons do not make the resist film, which can be generally regarded as an insulator, electrically conductive and diffuse and move on the charge dissipation layer in the same way as electrons. In that case, the charge amount distribution may be estimated and the irradiation position may be corrected by further taking diffusion of holes into consideration, and the above-described Eqs. (1) to (3) are replaced with Eqs. (5) to (9) using an analysis solution of a diffusion equation having two different diffusion coefficients Dn and Dp as in the following.

In the following equations, Dn represents a diffusion coefficient for electrons on the charge dissipation layer, Dp represents a diffusion coefficient for holes on the charge dissipation layer, Qn represents a charge amount immediately after beam irradiation due to electrons caused by the beam irradiation, and Qp represents a charge amount immediately after the beam irradiation due to holes generated by the beam irradiation.

$$C(x, y, t) = \sum_{k=0}^{j} c_k^n(x, y, t) + \sum_{k=0}^{j} c_k^p(x, y, t) \quad (5)$$

$$c_k^n = \frac{Q_n}{4}\left\{\mathrm{erf}\left(\frac{x - x_k - \frac{L}{2}}{\sigma_n}\right) - \mathrm{erf}\left(\frac{x - x_k + \frac{L}{2}}{\sigma_n}\right)\right\} \quad (6)$$

$$\left\{\mathrm{erf}\left(\frac{y - y_k - \frac{L}{2}}{\sigma_n}\right) - \mathrm{erf}\left(\frac{x - y_k + \frac{L}{2}}{\sigma_n}\right)\right\}$$

$$c_k^p = \frac{Q_p}{4}\left\{\mathrm{erf}\left(\frac{x - x_k - \frac{L}{2}}{\sigma_p}\right) - \mathrm{erf}\left(\frac{x - x_k + \frac{L}{2}}{\sigma_p}\right)\right\} \quad (7)$$

$$\left\{\mathrm{erf}\left(\frac{y - y_k - \frac{L}{2}}{\sigma_p}\right) - \mathrm{erf}\left(\frac{x - y_k + \frac{L}{2}}{\sigma_p}\right)\right\}$$

$$\sigma_n = \sqrt{4D_n(t - t_k)} \quad (8)$$

$$\sigma_p = \sqrt{4D_p(t - t_k)} \quad (9)$$

In this manner, two or more types of diffusion may be taken into consideration to estimate the charge amounts and correct the irradiation position.

Note that the effect of correction of the irradiation position on the basis of the charge distribution obtained by considering such diffusion coefficients depends on the magnitude relationship between "writing progress speed" and the diffusion coefficient D. The "writing progress speed" can be defined as the quotient of "the area of the writing region" divided by "writing time" and as, for example, the quotient of "the total area of the writing region" divided by "the total writing time".

When the diffusion coefficient D is sufficiently smaller than the writing progress speed, the diffusion phenomenon of electric charge during writing can be ignored, so that correction taking the diffusion coefficient D into consideration is unnecessary. In contrast, when the diffusion coefficient D is sufficiently larger than the writing progress speed, a position error due to electric charge remaining after, for example, static elimination decreases, and thus correction itself taking the charge effect into consideration is unnecessary. That is, in view of the effect of correction, it is preferable that the present embodiment be applied to a case where the diffusion coefficient D is set to be in a predetermined range with respect to the writing progress speed, and the range can be, for example, from 1% to 1000% higher than the writing progress speed.

Irradiation position shifts due to charging phenomena do not happen only to electron beam writing apparatuses. The present invention can be applied to a charged particle beam apparatus that uses a result obtained by irradiating a target position with a charged particle beam, the charged particle beam apparatus being, for example, an inspection apparatus that inspects a pattern using a charged particle beam such as an electron beam.

In the above-described embodiment, in order to reduce the effect of fogging charging in which electrons scattered in the writing space fall down onto the substrate, secondary electrons may be prevented from returning to the surface of the substrate by applying a positive potential to the bottom surface of the objective lens 12 (an objective optical system).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charged particle beam writing method in which a deflector is caused to deflect a charged particle beam and a pattern is written by irradiating a substrate with the charged particle beam, the charged particle beam writing method comprising:
    calculating a charge amount distribution based on a charge amount of a beam irradiation region on the substrate immediately after irradiation with the charged particle beam and a diffusion coefficient for electric charge of the substrate;
    calculating a position shift distribution of the charged particle beam on the substrate based on the charge amount distribution; and
    correcting an irradiation position of the charged particle beam based on the position shift distribution.

2. The method according to claim 1, wherein the diffusion coefficient is obtained based on a correlation between a position shift obtained from a result of writing performed in advance and a position shift obtained regarding the charge amount distribution calculated by changing the diffusion coefficient.

3. The method according to claim 2, wherein the result of writing performed in advance includes writing results corresponding to a plurality of respective irradiation amount conditions,
    for each irradiation amount condition, a first diffusion coefficient based on the correlation is obtained, and
    a second diffusion coefficient, which is the average of the first diffusion coefficients for the respective irradiation amount conditions, is used to calculate the charge amount distribution.

4. The method according to claim 1, wherein a writing region of the substrate is virtually divided into sections having a certain mesh size, a charge amount is obtained for each section as a solution of a diffusion equation using a charge amount immediately after the section is irradiated and the diffusion coefficient obtained in advance, and the charge amount distribution is calculated.

5. The method according to claim 1, wherein the charge amount distribution is obtained by considering two or more different diffusion coefficients.

6. A charged particle beam writing apparatus comprising:
an emitter emitting a charged particle beam;
a deflector deflecting the charged particle beam, which is emitted;
a stage on which a substrate is placed on which a pattern is to be written by being irradiated with the charged particle beam;
a charge amount calculator calculating a charge amount of a beam irradiation region of the substrate immediately after irradiation with the charged particle beam and calculating a charge amount distribution based on the charge amount and a diffusion coefficient for electric charge of the substrate;
a position shift calculator calculating a position shift distribution of the charged particle beam on the substrate based on the charge amount distribution; and
a corrector correcting an irradiation position of the charged particle beam based on the position shift distribution.

7. The apparatus according to claim 6, wherein the charge amount calculator virtually divides a writing region of the substrate into sections having a certain mesh size, obtains a charge amount for each section as a solution of a diffusion equation using a charge amount immediately after the section is irradiated and the diffusion coefficient obtained in advance, and calculates the charge amount distribution.

8. A computer-readable recording medium storing a program causing a computer that controls a charged particle beam writing apparatus that causes a deflector to deflect a charged particle beam and writes a pattern by irradiating a substrate with the charged particle beam to execute:
a step for calculating a charge amount distribution based on a charge amount immediately after irradiation with the charged particle beam and a diffusion coefficient for electric charge of the substrate;
a step for calculating a position shift distribution of the charged particle beam on the substrate based on the charge amount distribution; and
a step for correcting an irradiation position of the charged particle beam based on the position shift distribution.

9. The computer-readable recording medium according to claim 8, wherein the program causes the computer to operate so as to virtually divide a writing region of the substrate into sections having a certain mesh size, obtain a charge amount for each section as a solution of a diffusion equation using a charge amount immediately after the section is irradiated and the diffusion coefficient obtained in advance, and calculate the charge amount distribution.

* * * * *